United States Patent
Kishimoto

(10) Patent No.: US 8,258,407 B2
(45) Date of Patent: Sep. 4, 2012

(54) WIRING BOARD AND METHOD OF PREVENTING HIGH VOLTAGE DAMAGE

(75) Inventor: Koji Kishimoto, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 651 days.

(21) Appl. No.: 12/238,729

(22) Filed: Sep. 26, 2008

(65) Prior Publication Data

US 2009/0084587 A1    Apr. 2, 2009

(30) Foreign Application Priority Data

Oct. 2, 2007   (JP) .................................. 2007-258920

(51) Int. Cl.
*H05K 1/00* (2006.01)
*H05K 1/02* (2006.01)
*H05K 1/16* (2006.01)
*H05K 1/14* (2006.01)
*H05K 7/00* (2006.01)

(52) U.S. Cl. ........ 174/255; 174/250; 174/253; 174/260; 174/259; 361/736; 361/737; 361/748; 361/760; 361/777

(58) Field of Classification Search .......... 174/250–268; 361/736–812
See application file for complete search history.

(56) References Cited

U.S. PATENT DOCUMENTS 5,892,669 A * 4/1999 Shin ............................... 363/50
6,473,285 B1* 10/2002 Schlenz et al. ................ 361/112

FOREIGN PATENT DOCUMENTS

| JP | 6380871 | 5/1988 |
| JP | 2003110212 | 4/2003 |
| JP | 2006-216699 | 8/2006 |

* cited by examiner

*Primary Examiner* — Jayprakash N Gandhi
*Assistant Examiner* — Jerry Wu
(74) *Attorney, Agent, or Firm* — Gerald E. Hespos; Michael J. Porco

(57) ABSTRACT

A wiring board is provided to protect an electronic device from static electricity and lightning surge without reducing packaging density. A wiring board is provided with a first wiring pattern (3) including mounting pads (8, 10), on which an electronic device (5) is mounted, a second wiring pattern (21) having lower impedance than the first wiring pattern (3), ICT wirings (13, 15) extending from the mounting pads (8, 10) of the first wiring pattern (3), and ICT pads (17, 19) formed at distal ends of the ICT wirings (13, 15). The ICT wirings (13, 15) extend towards the second wiring pattern (21) so that the ICT pads (13, 15) are in the vicinity of the second wiring pattern (21), and discharge gaps (G) are formed between the ICT pads (13, 15) and the second wiring pattern (21).

13 Claims, 4 Drawing Sheets

WIRING BOARD AND METHOD OF PREVENTING HIGH VOLTAGE DAMAGE

BACKGROUND OF THE INVENTION

1. Field of the Invention

The invention relates to a wiring board used in an environment where high voltages from the outside such as static electricity and lightning surge are applied, as well as to a method of preventing high voltage damage of an electronic device connected to a wiring board.

2. Description of the Related Art

Japanese Unexamined Patent Publication No. 2003-110212 discloses a wiring board having specified wiring patterns and mounted with an electronic device. An ICT (in-circuit tester) pad is provided for each wiring pattern near the corresponding electronic device for a test to measure characteristic values of the electronic device.

FIG. 4 is a schematic diagram of a wiring board 60 having a wiring pattern with an ICT pad. The wiring board 60 includes a wiring pattern 63 connected with an electronic device 61, such as a capacitor, shown by broken line and having two terminals. The wiring pattern 63 includes a first wiring 63a having a mounting pad 64, on which one terminal 61a of the electronic device 61 is mounted, and a second wiring 63b having a mounting pad 65, on which the other terminal 61b of the electronic device 61 is mounted. ICT wirings 67, 68 extend from the mounting pads 64, 65 and have ICT pads 69, 70 formed at their distal ends. The respective ICT pads 69, 70 are used as testing elements for characteristic measurements of the corresponding electronic device 61.

A high voltage could be applied to input and output terminals of the electronic device 61 if the wiring board 60 of FIG. 4 is exposed to static electricity or a lightning surge of several 1000 to several 10000 V and can cause an internal fracture of the electronic device 61. An internal fracture will cause the electronic device 61 to experience functional decline or functional loss.

Japanese Unexamined Utility Model Publication No. H63-80871 and Japanese Unexamined Patent Publication No. 2006-216699 disclose measures against static electricity and lightning surge. More particularly, a discharge wiring 72 shown by dashed-dotted line is connected with the first wiring 63a, a discharge wiring 73 shown by dashed-dotted line is connected with the second wiring 63b and a discharge gap 75 of a specified dimension is formed between wiring edges 72a, 73a of these discharge wirings 72, 73. A voltage V due to static electricity or lightning surge applied to the electronic device 61 is discharged from the wiring edge 72a to the wiring edge 73a via the discharge gap 75, as shown by arrows, and escapes from an unillustrated ground circuit connected with the discharge wiring 73. Thus, the electronic device 61 is protected from static electricity or lightning surge.

The discharge gap fulfills the above effect. However, it is difficult to ensure a sufficient space for a circuit pattern for forming a discharge gap since electronic devices of recent years must have higher packaging density of a wiring board.

In view of the above problem, an object of the invention is to provide a wiring board and a protection method capable of protecting an electronic device from static electricity and lightning surge without reducing the packaging density of an electronic device.

SUMMARY OF THE INVENTION

The invention relates to a wiring board with a first wiring pattern that includes at least one mounting pad on which an electronic device is to be mounted. The wiring board also includes a second wiring pattern having lower impedance than the first wiring pattern. An ICT wiring extends from the mounting pad of the first wiring pattern, and at least one ICT pad is formed at or near a distal end of the ICT wiring. The ICT wiring extends towards the second wiring pattern such that the ICT pad is near the second wiring pattern and a discharge gap is formed between the ICT pad and the second wiring pattern.

A high voltage due to static electricity or lightning surge may be applied to the first wiring pattern mounted with the electronic device. This high voltage can be introduced first to the ICT wiring extending from the first wiring pattern mounted with the electronic device and then is discharged via the discharge gap formed between the ICT pad of the ICT wiring and the second wiring pattern. This high voltage then is caused to escape towards the second wiring pattern, which is near the ICT pad and which has a lower impedance than the first wiring pattern. Thus, the direct application of the voltage to the electronic device can be prevented. In this way, the electronic device is protected from internal fracture caused by static electricity or lightning surge.

The discharge gap can be formed between the ICT pad and the second wiring pattern by utilizing the ICT wiring extending from the mounting pad of the first wiring pattern. Therefore, a high voltage due to static electricity or lightning surge can be discharged via this discharge gap. As described above, the ICT pad conventionally is used only for a test to measure characteristic values of the electronic device. However, the ICT pad of the subject invention also is used as a discharge circuit pattern. Thus, there is no need for a separate wiring pattern to discharge a high voltage due to static electricity or lightning surge, and the wiring board can have a higher density.

The second wiring pattern preferably is formed with a ground land.

The ICT pad preferably is arranged in the vicinity of the ground land to form the discharge gap between the ICT pad and the ground land. According to this construction, even if a high voltage due to static electricity or lightning surge is applied to the first wiring pattern, this high voltage is discharged via the discharge gap between the ICT pad and the ground land. Therefore, the high voltage is grounded via the ground land, and the electronic device can be protected more easily from the high voltage.

The second wiring pattern preferably is formed with an electronic-device mounting pad.

The ICT pad preferably is arranged in the vicinity of the electronic-device mounting pad to form the discharge gap between the ICT pad and the electronic-device mounting pad. According to this construction, a high voltage due to static electricity or lightning surge that is applied to the first wiring pattern can be discharged via the discharge gap formed between the ICP pad and the electronic-device mounting pad to be introduced to the second wiring pattern. As a result, the electronic device is protected more easily from the high voltage. This construction is particularly advantageous when it is difficult to arrange the ICT pad near the ground land due to restrictions on wiring design.

A third wiring pattern preferably is provided. Thus, the first wiring pattern is connected with the electronic device via a first mounting pad. The second wiring has a second mounting pad connected to the electronic device, and the third wiring has a third mounting pad connected to the electronic device.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
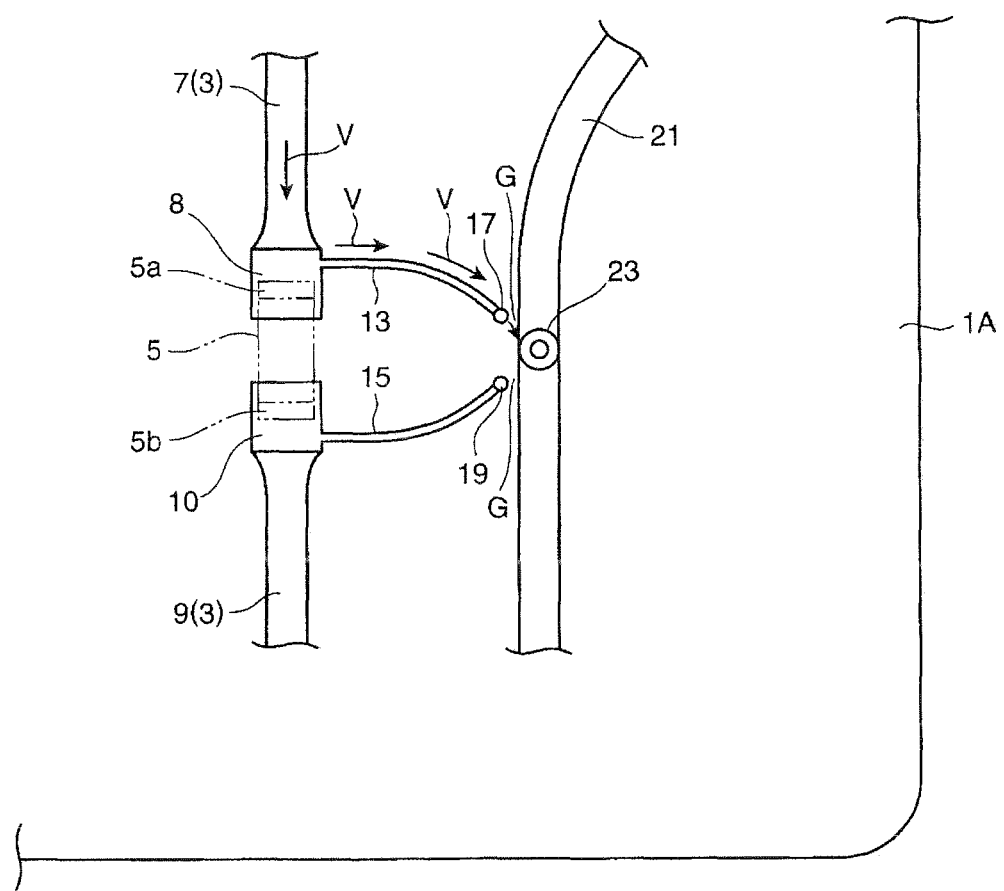
FIG. 1 is a schematic diagram showing a main part of a wiring board according to a first embodiment of the invention.

FIG. 1 is a schematic diagram showing a main part of a wiring board 1A according to a first preferred embodiment of the invention. The wiring board 1A includes first and second wiring patterns 3 and 21 respectively. The first wiring pattern 3 is connected with an electronic device 5, for example, a capacitor, shown by chain double-dashed line and having two terminals. More particularly, the first wiring pattern 3 includes a first wiring 7 having a first mounting pad 8 connected to one terminal 5a of the electronic device 5 and a second wiring 9 having a second mounting pad 10 connected to the other terminal 5b of the electronic device 5. The first wiring pattern 3 is connected with another wiring pattern (not shown), on which another electronic device (not shown) is mounted.

The second wiring pattern 21 has a lower impedance than the first wiring pattern 3 and includes a ground land 23 to be connected with a ground path. The ground land 23 is, for example, a GND through hole.

An electrically conductive ICT (in-circuit tester) wiring 13 extends from the first mounting pad 8 of the first wiring 7 and an electrically conductive ICT wiring 15 extends from the second mounting pad 10 of the second wiring 9. The ICT wirings 13, 15 extend such that ICT pads 17, 19 formed at their distal ends are in the vicinity of the ground land 23 of the second wiring pattern 21. Here, the "vicinity" means that the ICT pads 17, 19 are sufficiently close to the ground land 23 to induce discharge between the ICT pads 17, 19 and the ground land 23 prior to other parts of the wiring pattern when a sufficient static electricity or potential, preferably a static electricity or potential of several 1000 to several 10000 V (e.g. more than about 3000 V to less than about 50000 V), is applied to the first wiring pattern 3. Thus, discharge gaps G are formed between the respective ICT pads 17, 19 and the ground land 23 for discharging the static electricity applied to the first wiring pattern 3 as described later.

The ICT pads 17, 19 are brought into contact with an in-circuit tester (ICT) for a test for confirming whether the electronic device 5 mounted on the first wiring pattern 3 is connected electrically with a circuit and/or for a test for measuring characteristic values of the electronic device 5.

High voltage V due to static electricity or lightning surge may be applied to the first wiring pattern 3. However, a path for this high voltage V to escape is ensured via the second wiring pattern with the ground path. Specifically, the voltage V is introduced from the first mounting pad 8 to the electrically conductive ICT wiring 13, as shown by the arrows, and then is discharged via the discharge gap G between the ICT pad 17 and the ground land 23 of the second wiring pattern 21 to be grounded via the ground path of the ground land 23. In this way, the voltage V is not applied to the electronic device 5. Accordingly, the electronic device 5 will not be subject to an internal fracture and, consequently, the wiring board 1A mounted with the electronic device 5 and an electronic apparatus (not shown) incorporating this wiring board 1A will not be subject to functional decline or functional loss.

In the first embodiment, the ICT wirings 13, 15 provided for the above tests are laid in compliance with restriction on wiring design to form the discharge gaps G between the ICT pads 17, 19 and the ground land 23 without separately providing wiring patterns for discharge to form the discharge gaps G. Thus, the packaging density of the wiring board 1A is not reduced and a request for higher packaging density can be met. The ICT pads may be applied to mounting lands instead of the mounting pads. Further, instead of the ground land 23, a ground pad may be formed on the second wiring pattern 21.

Figure 2:
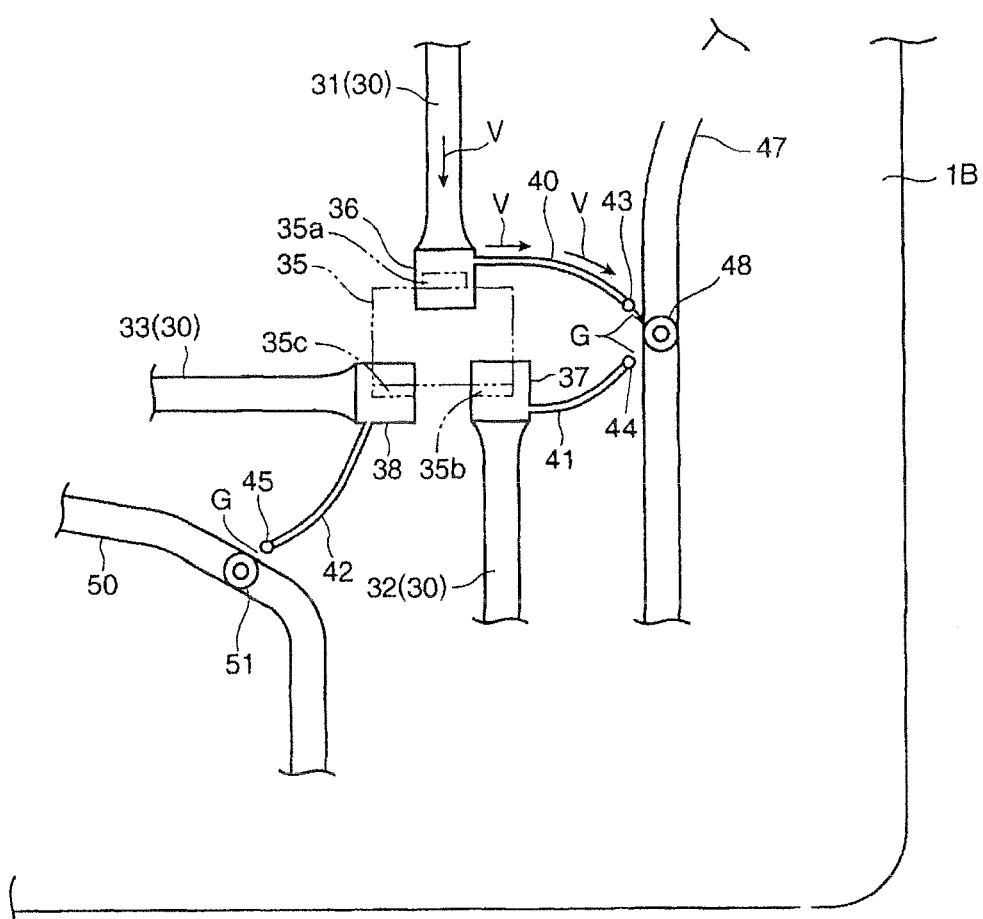
FIG. 2 is a schematic diagram showing a main part of a wiring board according to a second embodiment of the invention.

FIG. 2 is a schematic diagram showing a main part of a wiring board 1B according to a second embodiment of the invention. The wiring board 1B includes at least a first wiring pattern 30, a second wiring pattern 47 and a third wiring pattern 50. The first wiring pattern 30 is connected with an electronic device 35, for example, a transistor, shown by chain double-dashed line and having three terminals. The first wiring pattern 30 includes first, second and third wirings 31, 32 and 33. The first wiring 31 has a first mounting pad 36, on which a terminal 35a, e.g. an emitter terminal, of the electronic device 35 is to be mounted. The second wiring 32 has a second mounting pad 37, on which a terminal 35b, e.g. a collector terminal, of the electronic device 35 is to be mounted. The third wiring 33 has a third mounting pad 38, on which a terminal 35c, e.g. a base terminal, of the electronic device 35 is to be mounted. The first to third wirings 31, 32, 33 of the first wiring pattern 30 are connected with other wirings (not shown) connected with specified electronic devices.

The second wiring pattern 47 has lower impedance than the first wiring pattern 30 and includes a ground land 48 to be connected with a ground path. The third wiring pattern 50 also has lower impedance than the first wiring pattern 30 and includes a ground land 51 to be connected with a ground path. The ground lands 48, 51 are, for example, GND through holes.

Electrically conductive ICT wirings 40, 41, 42 extend from the respective mounting pads 36, 37, 38 of the first to third wirings 31, 32, 33. The respective ICT wirings 40, 41 extend such that ICT pads 43, 44 at their distal ends are in the vicinity of the ground land 48 of the second wiring pattern 47. On the other hand, the ICT wiring 42 extends such that an ICT pad 45 at its distal end is in the vicinity of the ground land 51 of the third wiring pattern 50. Thus, discharge gaps G are formed between the respective ICT pads 43, 44 and the ground land 48 and between the ICT pad 45 and the ground land 51 for discharging static electricity applied to the first wiring pattern 30.

Voltage V due to static electricity or lightning surge may be applied to the first wiring pattern 30. However, the second embodiment ensures paths for causing this high voltage V to escape via the second wiring pattern 47 and/or the third wiring pattern 50. Specifically, a high voltage V applied to the first wiring 31 of the first wiring pattern 30 is introduced from the first mounting pad 36 to the electrically conductive ICT wiring 40, as shown by arrows, and then is discharged via the discharge gap G between the ICT pad 43 and the ground land 48 to be grounded via the ground path of the ground land 48. In this way, the voltage V is not applied directly to the electronic device 35. Accordingly, the internal fracture of the electronic device 35 is prevented and, consequently, the wiring board 1B mounted with the electronic device 35 and an electronic apparatus (not shown) incorporating this wiring board 1B are prevented from functional decline or functional loss.

In the second embodiment, the ICT wirings 40, 41, 42 provided for the tests are laid in compliance with restriction on wiring design to form the discharge gaps G between the ICT pads 43, 44, 45 and the ground lands 48, 51 without separately providing wiring patterns for discharge to form the discharge gaps G. Thus, the packaging density of the wiring board 1B is not reduced and a request for higher packaging density can be met. The ICT pads may be applied to mounting lands instead of the mounting pads. Further, instead of the ground lands 48, 51, ground pads may be formed on the second and third wiring patterns 47, 50.

Figure 3:
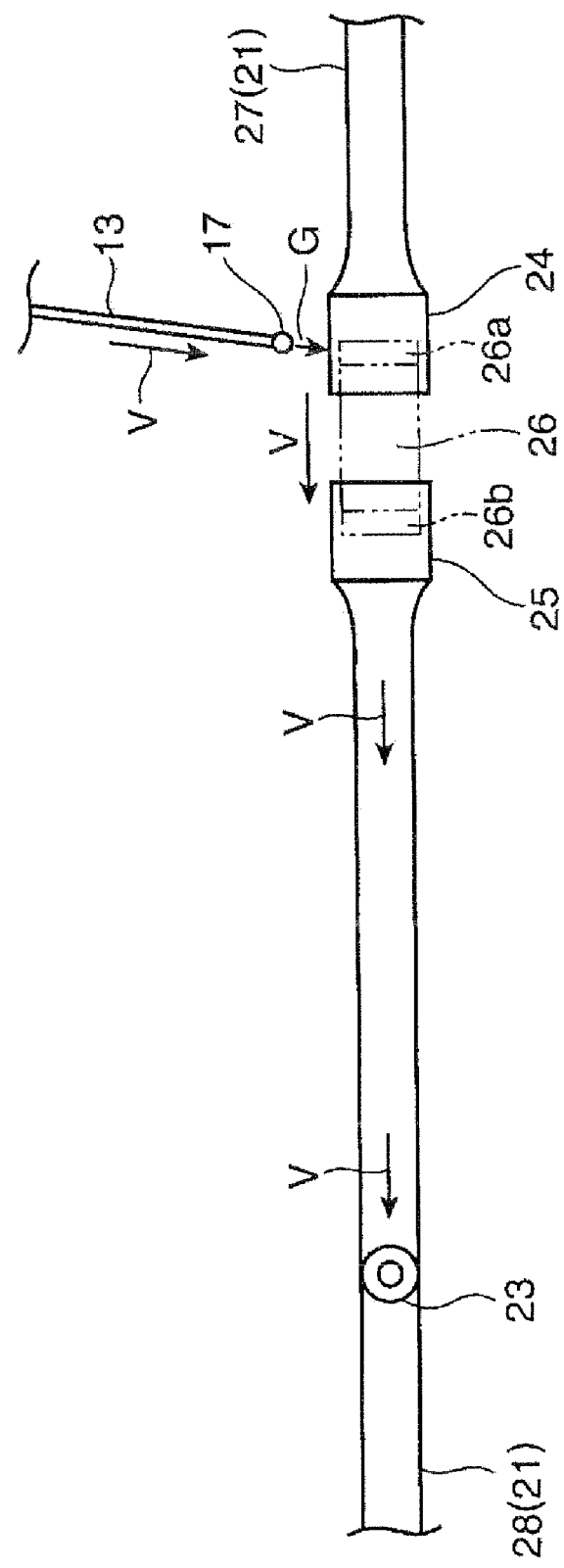
FIG. 3 is a schematic diagram showing a modification of the wiring board according to the first embodiment of the invention.
Figure 4:
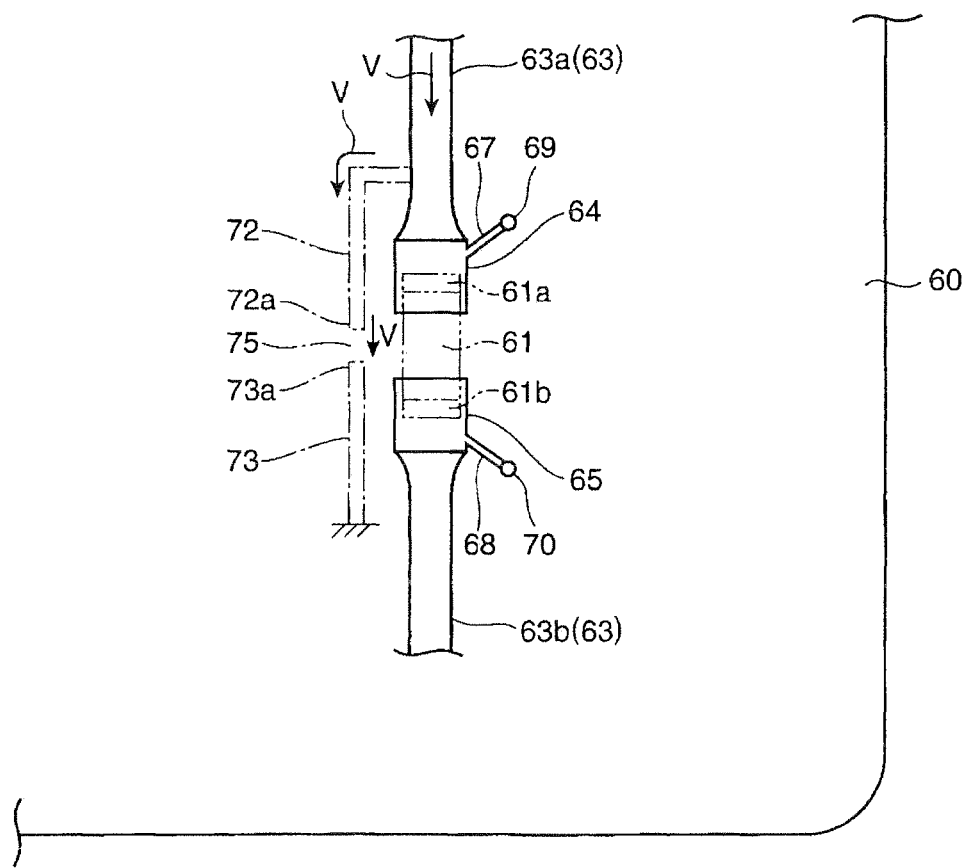
FIG. 4 is a schematic diagram showing a part of a conventional wiring board.

FIG. 3 is a schematic diagram showing a modification of the first embodiment shown in FIG. 1. In this modification, a second wiring pattern 21 is to be connected with an electronic device 26 shown by chain double-dotted line and has two terminals. The second wiring pattern 21 has a first wiring 27 with a first mounting pad 24, on which one terminal 26a of the electronic device 26 is to be mounted, and a second wiring 28 with a second mounting pad 25, on which the other terminal 26b of the electronic device 26 is to be mounted. An ICT wiring 13 extends so that an ICT pad 17 is located in the vicinity of the first mounting pad 24 of the first wiring 27 instead of being located in the vicinity of a ground land 23 of the second wiring pattern 21. Thus, a discharge gap G is formed between the ICT pad 17 and the mounting pad 24 for discharging a high voltage applied to a first wiring pattern.

The electronic device 26 mounted on the mounting pads 24, 25 of the second wiring pattern 21 may be any electronic device having a resistance value sufficiently lower than that of the electronic device 5 mounted on the first wiring pattern 3 of FIG. 1. An electronic device having an avalanche effect such as a zener diode or a MOSFET may be used as such an electronic device 26.

Voltage V due to static electricity or lightning surge introduced to the ICT wiring 13 first is discharged via the discharge gap G formed between the ICT pad 17 and the first mounting pad 24 and then is grounded via a ground path of the ground land 23 of the second wiring 28 through the electronic device 26 mounted on the mounting pads 24, 25. In this way, voltage is not applied directly to the electronic device 5 (see FIG. 1) mounted on the first wiring pattern 3 (see FIG. 1). Mounting lands, on which lead parts are mounted, may be provided instead of the mounting pads 24, 25.

The modification of FIG. 3 is particularly advantageous when it is difficult to arrange the ICT pad 17 in the vicinity of the ground land 23 of the second wiring pattern 21 due to restriction on wiring design.

The modification of FIG. 3 is also applicable to the second embodiment of FIG. 2.

The wiring boards described above can be used for electrical components mounted in automotive vehicles required to operate without any problem even upon the application of strong static electricity (about ±25 kv).

What is claimed is:

1. A wiring board, comprising:
    a first wiring pattern including at least one mounting pad, the at least one mounting pad being configured for an electronic device to be mounted thereon,
    a second wiring pattern having lower impedance than the first wiring pattern, the second wiring pattern being separate and unconnected from the first wiring pattern,
    an ICT (in-circuit) wiring having a first end connected to the at least one mounting pad of the first wiring pattern and a distal end extending from the at least one mounting pad of the first wiring pattern, and
    at least one ICT pad formed at the distal end of the ICT wiring, the at least one ICT pad for measuring characteristic values of the electronic device mounted on the at least one mounting pad,
    wherein the ICT wiring extends towards the second wiring pattern so that the at least one ICT pad formed at the distal end of the ICT wiring is located in the vicinity of the second wiring pattern forming a discharge gap (G) between the at least one ICT pad and a corresponding ground land on the second wiring pattern to induce discharge between the at least one ICT pad and the second wiring pattern when static electricity above a predetermined value is applied to the first wiring pattern preventing application of the static electricity to the electronic device.

2. The wiring board of claim 1, wherein the second wiring pattern is formed with a ground land.

3. The wiring board of claim 2, wherein the at least one ICT pad is arranged in the vicinity of the ground land to form the discharge gap (G) between the at least one ICT pad and the ground land.

4. The wiring board of claim 1, wherein the second wiring pattern is formed with an electronic-device mounting pad.

5. The wiring board of claim 4, wherein the ICT pad is arranged in the vicinity of the electronic-device mounting pad to form the discharge gap (G) between the ICT pad and the electronic-device mounting pad.

6. The wiring board of claim 1, wherein a third wiring pattern is provided and the first wiring pattern includes first, second and third wirings, wherein the first wiring pattern is connected with the electronic device via the first wiring and a first mounting pad, the second wiring having a second mounting pad connected to the electronic device, and a third wiring having a third mounting pad connected to the electronic device.

7. The wiring board of claim 6, wherein the third wiring pattern has lower impedance than the first wiring pattern, and further comprising
    at least one second ICT wiring extending from the second or third mounting pad of the first wiring pattern, and
    at least one second ICT pad formed at or near a distal end of the second ICT wiring,
    wherein the at least one second ICT wiring extends towards the second or third wiring pattern so that the at least one second ICT pad is located in the vicinity of the second or third wiring pattern and a discharge gap (G) is formed between the at least one second ICT pad and the second or third wiring pattern.

8. A wiring board, comprising:
    a first wiring pattern including first and second mounting pads, the first and second mounting pads being configured for an electronic device to be mounted therebetween,
    a second wiring pattern having lower impedance than the first wiring pattern, the second wiring pattern being separate and unconnected from the first wiring pattern,
    a first ICT wiring having a first end connected to the first mounting pad of the first wiring pattern and a distal end extending from the first mounting pad of the first wiring pattern,
    a first ICT pad formed at the distal end of the first ICT wiring, a second ICT wiring having a first end connected to the second mounting pad of the first wiring pattern and a distal end extending from the second mounting pad of the first wiring pattern, and a second ICT pad formed at the distal end of the second ICT wiring, the first and second ICT pads being configured for measuring characteristic values of the electronic device held between the first and second mounting pads, wherein the first and second ICT wirings extend towards the second wiring pattern so that the first and second ICT pads formed at the distal ends of the first and second ICT wirings respectively are located in the vicinity of the second wiring pattern forming a discharge gap (G) between the first and second ICT pads and the second wiring pattern to induce discharge between the first and second ICT pads and a corresponding ground land on the second wiring pattern when static electricity above a predetermined value is applied to the first wiring pattern preventing application of the static electricity to the electronic device held between the first and second mounting pads.

9. The wiring board of claim 8, wherein the second wiring pattern is formed with a ground land.

10. The wiring board of claim 9, wherein the first and second ICT pads are arranged in the vicinity of the ground land to form the discharge gap (G) between the first and second ICT pads and the ground land.

11. The wiring board of claim 10, wherein the first wiring pattern includes a third mounting pad, on which the electronic device is to be mounted, and further comprising a third wiring pattern having lower impedance than the first wiring pattern, a third ICT wiring extending from the third mounting pad of the first wiring pattern, and a third ICT pad formed at or near a distal end of the third ICT wiring, wherein the third ICT wiring extends towards the third wiring pattern so that the third ICT pad is located in the vicinity of the third wiring pattern and a discharge gap (G) is formed between the third ICT pad and the third wiring pattern.

12. The wiring board of claim 11, wherein the third wiring pattern is formed with a second ground land.

13. The wiring board of claim 12, wherein the third ICT pad is arranged in the vicinity of the second ground land to form the discharge gap (G) between the third ICT pads and the second ground land.

* * * * *